United States Patent
Ningaraju et al.

(10) Patent No.: US 10,615,077 B2
(45) Date of Patent: Apr. 7, 2020

(54) SEMICONDUCTOR DEVICES AND METHODS OF FABRICATING THE SAME

(71) Applicant: NUVOTON TECHNOLOGY CORPORATION, Hsinchu (TW)

(72) Inventors: Vivek Ningaraju, Mysore (IN); Po-An Chen, Toufen (TW); Ching-Yuan Liao, Hsinchu (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 16/235,220

(22) Filed: Dec. 28, 2018

(65) Prior Publication Data

US 2019/0206735 A1    Jul. 4, 2019

(30) Foreign Application Priority Data

Dec. 29, 2017    (TW) .............................. 106146497 A

(51) Int. Cl.
*H01L 29/861*    (2006.01)
*H01L 23/60*    (2006.01)
(Continued)

(52) U.S. Cl.
CPC ...... *H01L 21/822* (2013.01); *H01L 21/76237* (2013.01); *H01L 23/60* (2013.01);
(Continued)

(58) Field of Classification Search
CPC ........... H01L 29/66136; H01L 29/8611; H01L 29/8613; H01L 23/60; H01L 23/62
(Continued)

(56) References Cited

U.S. PATENT DOCUMENTS 8,846,486 B2    9/2014  Koburger, III et al.
2008/0290462 A1  11/2008  Schmenn et al.
(Continued)

FOREIGN PATENT DOCUMENTS

TW    I601287 B    10/2017
TW    200826276 A    6/2018

OTHER PUBLICATIONS

An Office Action of corresponding TW patent application No. 106146497 dated May 10, 2018; pp. 1-5.

*Primary Examiner* — David Vu
*Assistant Examiner* — Brandon C Fox
(74) *Attorney, Agent, or Firm* — Muncy, Geissler, Olds & Lowe, PC

(57) ABSTRACT

Semiconductor devices and methods of fabricating the same are provided. The semiconductor device includes a substrate having a first conductive type. A second conductive type first epitaxial layer is disposed over the substrate. A second conductive type second epitaxial layer is disposed over the second conductive type first epitaxial layer. An active region of the substrate includes a first conductive type buried layer in the second conductive type first and second epitaxial layers. A first conductive type doped well region is disposed in the second conductive type second epitaxial layer. A second conductive type heavily doped region is disposed over the first conductive type doped well region. A first trench isolation feature is disposed in the substrate. In addition, a first conductive type doped region is disposed between a bottom surface of the first trench isolation feature and the first conductive type buried layer.

20 Claims, 9 Drawing Sheets

(51) Int. Cl.
*H01L 23/62* (2006.01)
*H01L 27/02* (2006.01)
*H01L 21/822* (2006.01)
*H01L 27/08* (2006.01)
*H01L 21/762* (2006.01)
*H01L 29/66* (2006.01)

(52) U.S. Cl.
CPC .......... *H01L 23/62* (2013.01); *H01L 27/0255* (2013.01); *H01L 27/0814* (2013.01); *H01L 29/66136* (2013.01); *H01L 29/8611* (2013.01); *H01L 29/8613* (2013.01); *H01L 27/0248* (2013.01)

(58) Field of Classification Search
USPC .................................................. 257/106, 112
See application file for complete search history.

(56) References Cited

U.S. PATENT DOCUMENTS

| | | | |
|---|---|---|---|
| 2010/0244090 A1* | 9/2010 | Bobde | H01L 27/0259 257/112 |
| 2012/0080769 A1* | 4/2012 | Sharma | H01L 27/0255 257/529 |
| 2013/0001694 A1* | 1/2013 | Guan | H01L 27/0255 257/355 |
| 2015/0108536 A1* | 4/2015 | Pan | H01L 29/0615 257/112 |
| 2015/0364460 A1* | 12/2015 | Huang | H01L 27/0255 257/106 |
| 2017/0084601 A1* | 3/2017 | Yao | H01L 27/0255 |
| 2017/0141097 A1* | 5/2017 | Bobde | H01L 29/43 |
| 2017/0243965 A1 | 8/2017 | Yao et al. | |

* cited by examiner

SEMICONDUCTOR DEVICES AND METHODS OF FABRICATING THE SAME

CROSS REFERENCE TO RELATED APPLICATIONS

This Application claims priority of Taiwan Patent Application No. 106146497, filed on Dec. 29, 2017, the entirety of which is incorporated by reference herein.

BACKGROUND

Field

The disclosure relates to semiconductor devices and fabrication methods thereof, and more particularly, to transient-voltage-suppression (TVS) diode devices and methods of fabricating the same.

Description of the Related Art

Transient-voltage-suppression (TVS) diodes are usually used for protecting integrated circuits from being damaged by transient over-voltage (or over-current) events which may accidentally occur. Examples of such events include electrostatic discharge (ESD), rapid transient voltage (or current), and lightning. When the TVS diodes are subjected to the above transient over-voltage (or over-current) events, the working impedances of the TVS diodes are immediately reduced to an extreme low turn-on value, and thereby allow a large current to pass through. At the same time, the voltage is limited to a predetermined level. Therefore, the TVS diodes are widely used in electric supply lines and data lines of universal serial bus (USB), digital video interface, Fast Ethernet, notebook computers, displays, flat-panel displays etc. as a circuit protection element. However, TVS diodes are continuously challenged by further reducing capacitance while using simple and low-cost fabricating processes.

Therefore, a TVS diode which can overcome the above issues is required in this technical field.

BRIEF SUMMARY

In some embodiments, a semiconductor device is provided. The semiconductor device includes a substrate having a first conductive type and an active region. The semiconductor device also includes a second conductive type first epitaxial layer disposed over the substrate, wherein the second conductive type first epitaxial layer has a second conductive type, and the second conductive type is different from the first conductive type. The semiconductor device further includes a second conductive type second epitaxial layer disposed over the second conductive type first epitaxial layer, wherein the second conductive type second epitaxial layer has the second conductive type. The active region includes a first conductive type buried layer disposed in the second conductive type first epitaxial layer and the second conductive type second epitaxial layer. The active region also includes a first conductive type doped well region disposed in the second conductive type second epitaxial layer and having the first conductive type. The active region further includes a second conductive type heavily doped region disposed over the first conductive type doped well region and having the second conductive type. In addition, the active region includes a first trench isolation feature disposed in the substrate, and a first conductive type doped region disposed between a bottom surface of the first trench isolation feature and the first conductive type buried layer.

In some embodiments, a method of fabricating a semiconductor device is provided. The method includes providing a substrate having a first conductive type and an active region. The method also includes performing a first epitaxial growth process to form a second conductive type first epitaxial layer over the substrate, wherein the second conductive type first epitaxial layer has a second conductive type, and the second conductive type is different from the first conductive type. The method further includes performing a first ion implantation process to form a first conductive type buried layer in the second conductive type first epitaxial layer in the active region, wherein the first conductive type buried layer has the first conductive type. In addition, the method includes performing a second epitaxial growth process to form a second conductive type second epitaxial layer over the second conductive type first epitaxial layer, wherein the second conductive type second epitaxial layer has the second conductive type. The method also includes forming a first trench in the second conductive type second epitaxial layer in the active region, wherein a bottom surface of the first trench is located between a top surface of the second conductive type second epitaxial layer and the first conductive type buried layer. The method further includes performing a second ion implantation process to form a first conductive type doped region in the second conductive type second epitaxial layer that is exposed by the bottom surface of the first trench. In addition, the method includes forming a first trench isolation feature in the first trench, and forming a second trench isolation feature at a boundary of the active region. In addition, the method includes performing a third ion implantation process to form a first conductive type doped well region in the second conductive type second epitaxial layer in the active region, wherein the first conductive type doped well region has the first conductive type.

A detailed description is given in the following embodiments with reference to the accompanying drawings.

BRIEF DESCRIPTION OF DRAWINGS

The embodiments of the disclosure can be more fully understood by reading the subsequent detailed description and examples with references made to the accompanying drawings. For clarity of illustration, various elements in the drawings may not be drawn in scale, wherein.

DETAILED DESCRIPTION

Figure 1:
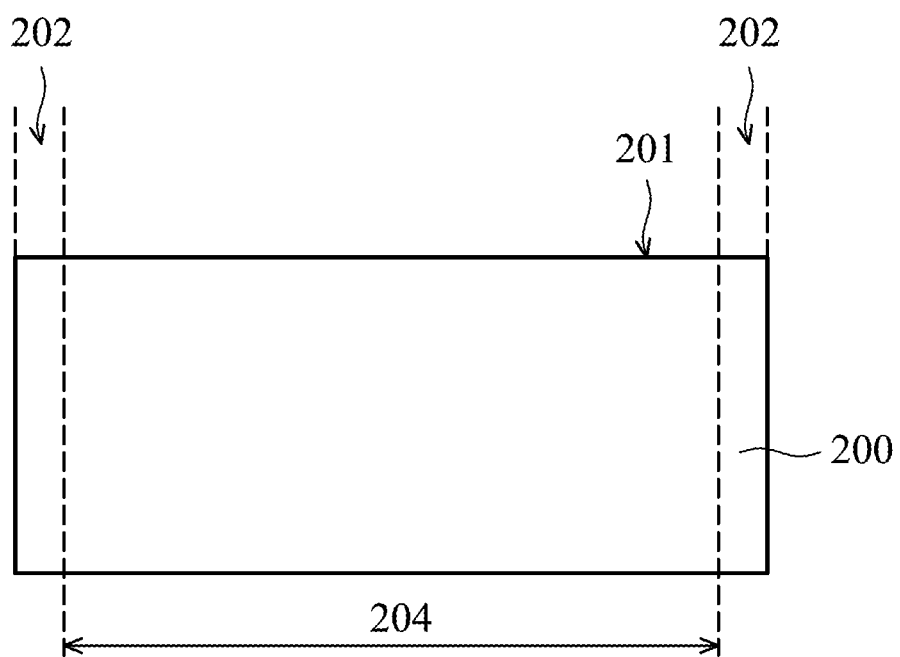
FIGS. 1 to 9 show schematic cross sections of various intermediate stages of a method of fabricating a semiconductor device according to some embodiments.

The following description is the contemplated mode of carrying out some embodiments of the disclosure. The following disclosure provides many different embodiments for implementing different features of the disclosure. Various components and arrangements in the embodiments are made for the purpose of illustrating the general principles of some embodiments of the invention and should not be taken in a limiting sense. In addition, the present disclosure may repeat reference numerals and/or letters in the figures of embodiments. This repetition is for the purpose of simplicity and clarity and does not in itself dictate a relationship between the various embodiments.

According to embodiments of the disclosure, semiconductor devices and methods of fabricating the same, for example transient-voltage-suppression (TVS) diode devices and methods of fabricating the same are provided. During fabrication of transient-voltage-suppression (TVS) diode devices, between two ion implantation processes for forming a buried layer and a doped well region, respectively, a shallow trench is formed directly on the buried layer in an active region (also referred to as a device region) and then a trench ion implantation process is performed. In which, the buried layer and the doped well region have a conductive type that is opposite to another conductive type of an epitaxial layer. The trench ion implantation process implants a dopant having the same conductive type as that of the buried layer from the bottom surface of the shallow trench. Thereafter, an isolation feature is formed to fill the shallow trench. Next, an ion implantation process for the doped well region is performed, which has the same process condition as that of the trench ion implantation process. The shallow trench and the trench ion implantation process can form a connecting doped region for connecting the buried layer and the doped well region which have the same conductive type but different depths. The connecting doped region can avoid forming an undesired silicon controlled rectifier structure that is due to a poor connection between the buried layer and the doped well region caused by conventional processes. Moreover, an ion implantation equipment with a low implantation energy (such as several thousands of electron volt (KeV)) is used to form the doped region having a deep depth of about 6 μm to about 8 μm.

FIGS. 1 to 9 show schematic cross sections of various intermediate stages of a method of fabricating a semiconductor device 500 according to some embodiments. For example, the various intermediate stages as shown in FIGS. 1 to 9 are used for forming the semiconductor device 500 of a transient-voltage-suppression (TVS) diode device. However, the various intermediate stages as shown in FIGS. 1 to 9 can also be used for other types of semiconductor devices. Referring to FIG. 1, firstly, a substrate 200 is provided. The substrate 200 is doped with a dopant to have a first conductive type. For example, while the first conductive type is p-type, the substrate 200 is a p-type substrate. In some embodiments, the substrate 200 has a dopant concentration of about $10^{19}$ atoms/cm$^3$ to about $10^{21}$ atoms/cm$^3$, and thereby the substrate 200 is a heavily doped p-type substrate. In some embodiments, the substrate 200 is a silicon substrate. In some other embodiments, the substrate 200 is made of silicon-germanium (SiGe), bulk semiconductor, strained semiconductor, compound semiconductor, or other suitable semiconductor materials.

As shown in FIG. 1, the substrate 200 includes several trench isolation feature defined regions 202 to define the area of an active region 204 for forming a semiconductor device. In some embodiments, the active region 204 is provided to form one semiconductor device thereon, and thereby the active region 204 can be referred to a device region. Accordingly, the trench isolation feature defined regions 202 for electrically isolating different devices (or device regions) can be located at the boundary of the active region 204. In some embodiments as shown in FIG. 1, the trench isolation feature defined regions 202 are extended along a direction that is perpendicular to a top surface 201 of the substrate 200 and is arranged along another direction that is parallel to the top surface 201 of the substrate 200 to define the active region 204 of the substrate 200. In some other embodiments, the number of the trench isolation features can be increased to divide the substrate 200 into multiple adjacent active regions.

Figure 2:
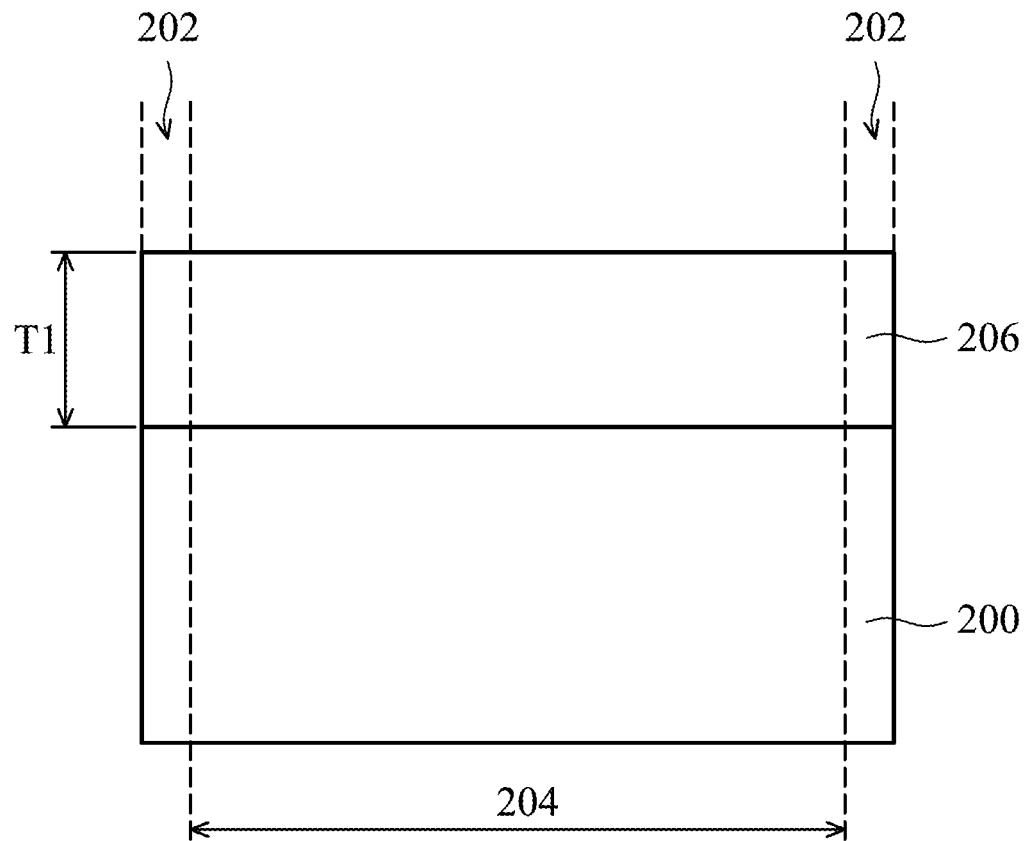

Referring to FIG. 2, then an epitaxial growth process is performed to form a second conductive type epitaxial layer 206 on the entire top surface 201 of the substrate 200. The epitaxial growth process includes for example metal organic chemical vapor deposition (MOCVD), metal-organic vapor-phase epitaxy (MOVPE), plasma enhanced chemical vapor deposition (PECVD), remote plasma chemical vapor deposition (RPCVD), molecular beam epitaxy (MBE), hydride vapor phase epitaxy (HVPE), liquid-phase epitaxy (LPE), chloride-vapor phase epitaxy (Cl-VPE), or similar epitaxy methods. In some embodiments, during performing the epitaxial growth process, phosphine or arsine is added to the reactant gas for performing an in-situ doping to form the second conductive type epitaxial layer 206. In some other embodiments, an un-doped epitaxial layer (not shown) is firstly formed and then the un-doped epitaxial layer is doped with phosphorus ion or arsenic ion to form the second conductive type epitaxial layer 206.

The material of the second conductive type epitaxial layer 206 includes silicon, germanium, silicon-germanium (SiGe), Group III-V compounds, or a combination thereof. The second conductive type epitaxial layer 206 has a second conductive type, and the second conductive type is different from the first conductive type. For example, when the first conductive type is P-type, the second conductive type is N-type, and the second conductive type epitaxial layer 206 can be referred to an N-type epitaxial layer 206. In some embodiments, the second conductive type epitaxial layer 206 has a dopant concentration of about $10^{10}$ atoms/cm$^3$ to about $10^{16}$ atoms/cm$^3$. In addition, the second conductive type epitaxial layer 206 has a thickness T1 of about 3 μm to about 8 μm, for example about 5 μm.

Figure 3:
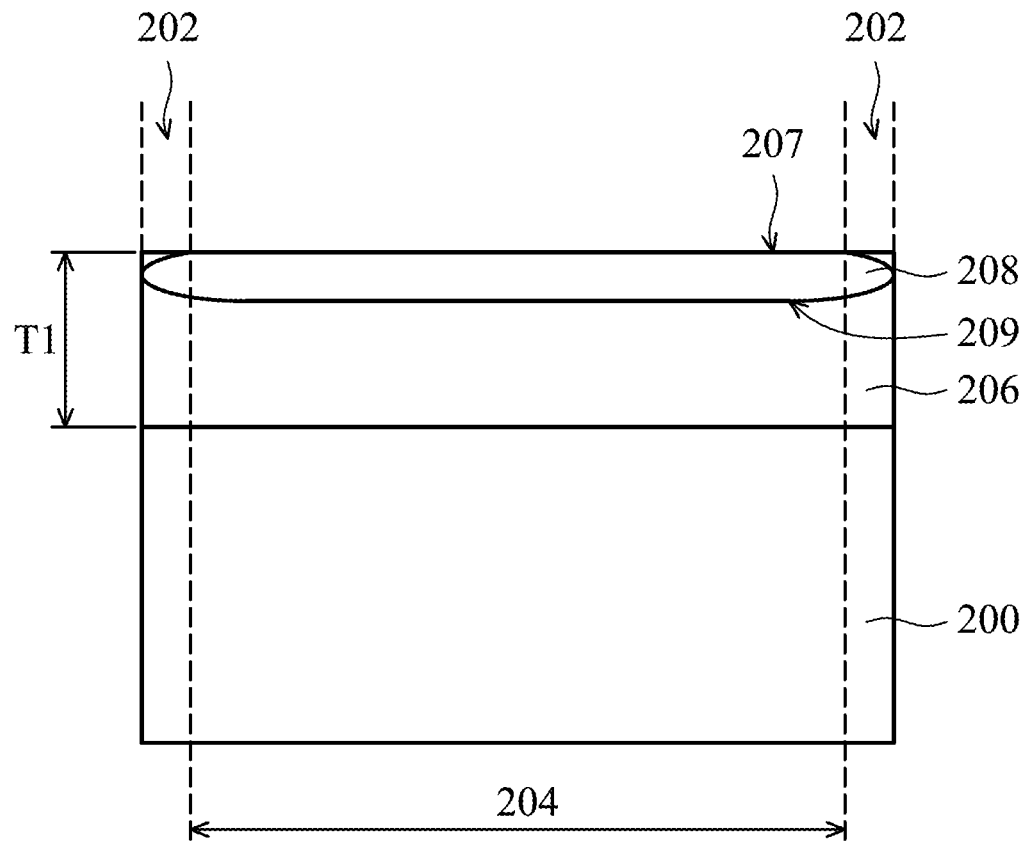

Next, referring to FIG. 3, an ion implantation process is performed to form a first conductive type buried layer 208 in the second conductive type epitaxial layer 206 in the active region 204. The first conductive type buried layer 208 has the first conductive type. For example, when the first conductive type is P-type, the first conductive type buried layer 208 can be referred to a P-type buried layer 208. In some embodiments, the first conductive type buried layer 208 has a dopant concentration that is greater than a dopant concentration of the substrate 200 having the first conductive type. For example, the first conductive type buried layer 208 has a dopant concentration of about $10^{18}$ atoms/cm$^3$ to about $10^{21}$ atoms/cm$^3$. Moreover, a top surface of the first conductive type buried layer 208 is level with a top surface 207 of the second conductive type epitaxial layer 206. A bottom surface 209 of the first conductive type buried layer 208 is located in the second conductive type epitaxial layer 206 and does not extend to contact an interface between the second conductive type epitaxial layer 206 and the substrate 200, in which the interface is located at the top surface 201 of the substrate 200. In addition, two sides of the first conductive type buried layer 208 are respectively at the trench isolation feature defined regions 202. In some embodiments, after the first conductive type buried layer 208 is formed, an annealing process is performed to make the dopants in the first conductive type buried layer 208 diffuse uniformly.

Figure 4:
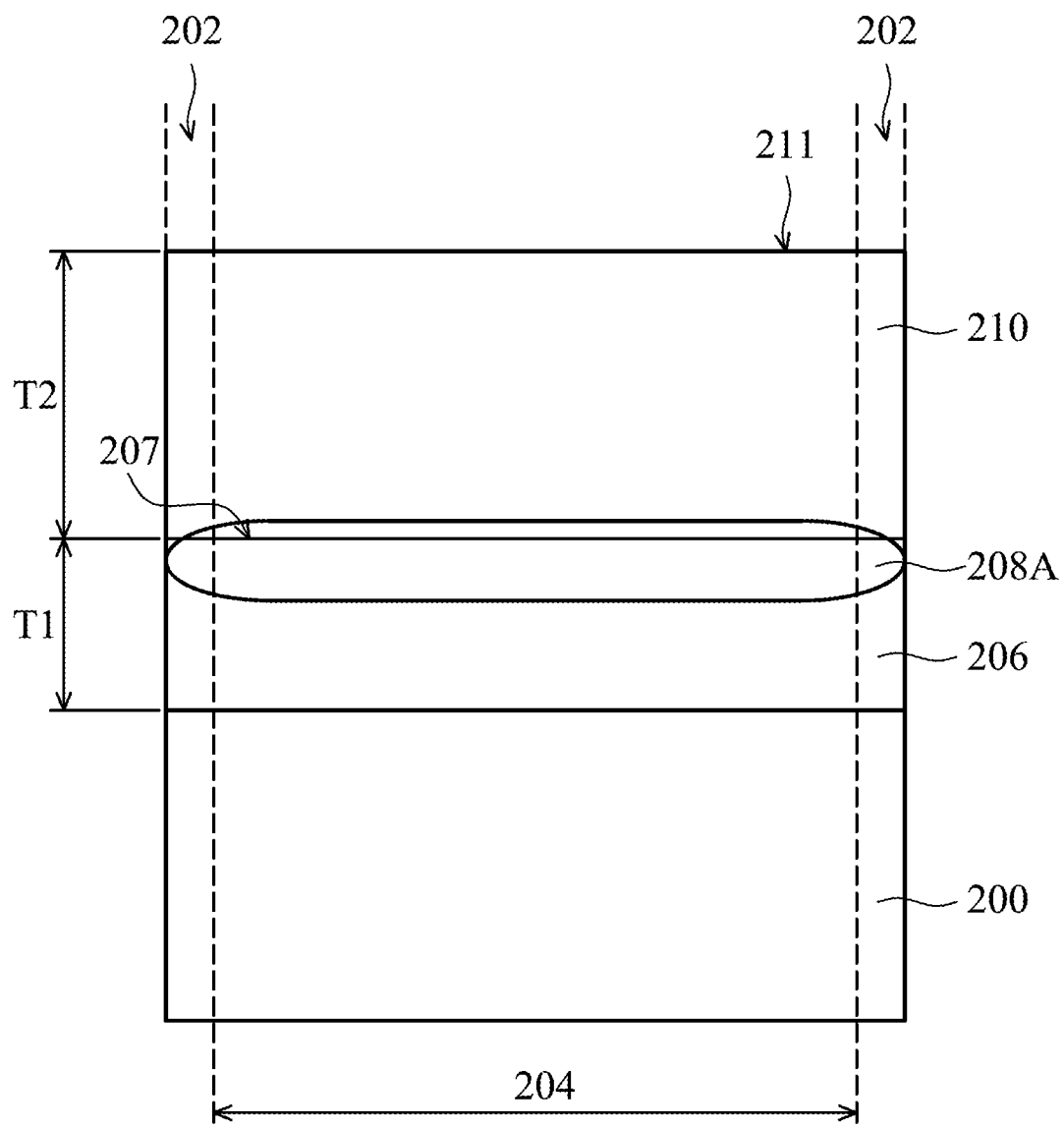

Then, referring to FIG. 4, another epitaxial growth process is performed to form a second conductive type epitaxial layer 210 on the entire second conductive type epitaxial layer 206. The second conductive type epitaxial layer 210 completely covers the second conductive type epitaxial layer 206, and the top surface 207 and the bottom surface (located at the top surface 201 of the substrate 200) of the second conductive type epitaxial layer 206 are respectively adjacent to the bottom surface of the second conductive type epitaxial layer 210 and the top surface 201 of the substrate 200. The second conductive type epitaxial layer 210 has the second conductive type. For example, when the first conductive type is P-type, the second conductive type is N-type, and the second conductive type epitaxial layer 210 can be referred to an N-type epitaxial layer 210. In some embodiments, the process, the dopant concentration and a thickness T2 of the second conductive type epitaxial layer 210 are the same as or similar to those of the second conductive type epitaxial layer 206. In some other embodiments, the thickness T2 of the second conductive type epitaxial layer 210 may be larger or smaller than the thickness T1 of the second conductive type epitaxial layer 206.

In some embodiments, during the process of forming the second conductive type epitaxial layer 210, the dopant in the first conductive type buried layer 208 that is located in the second conductive type epitaxial layer 206 can diffuse from the second conductive type epitaxial layer 206 into a part of the second conductive type epitaxial layer 210 to form a diffused first conductive type buried layer 208A. Therefore, the diffused first conductive type buried layer 208A is located in the second conductive type epitaxial layer 206 and the second conductive type epitaxial layer 210, and is close to the interface between the second conductive type epitaxial layer 206 and the second conductive type epitaxial layer 210, in which the interface is located at the top surface 207 of the second conductive type epitaxial layer 206.

In some other embodiments, one-step epitaxial growth process is used to form a second conductive type epitaxial single layer with a thick thickness, which can replace the two-step epitaxial growth process of respectively forming the two second conductive type epitaxial layers 206 and 210 with a thinner thickness in each epitaxial layer. Therefore, the thickness of the second conductive type epitaxial single layer can be a total thickness of the two second conductive type epitaxial layers 206 and 210 (the sum of the thickness T1 and the thickness T2). In addition, after the second conductive type epitaxial single layer is formed, an ion implantation process is performed to form the first conductive type buried layer 208 therein.

Figure 5:
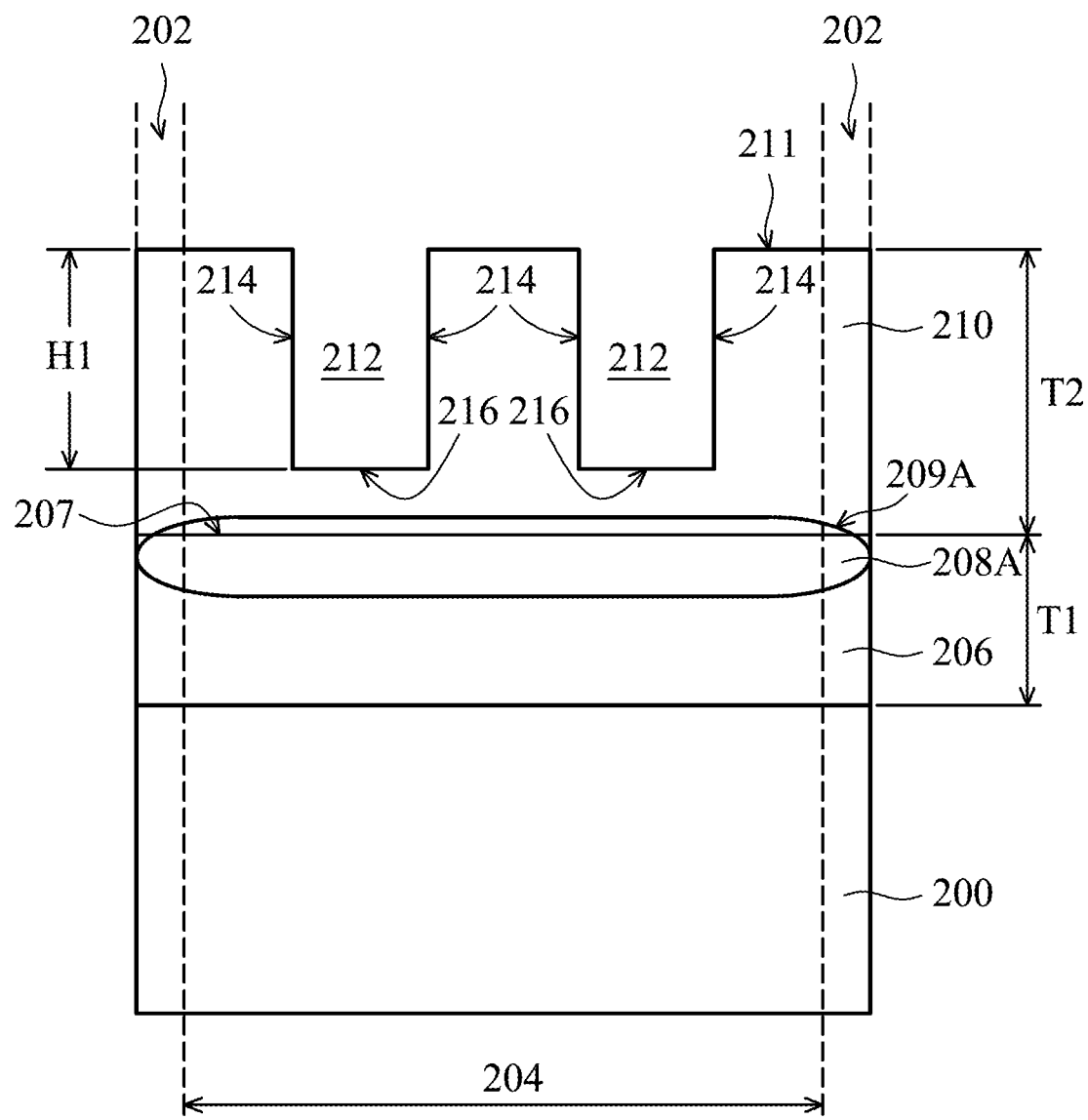

Next, referring to FIG. 5, a patterning process is performed to form one or more trench 212 in the second conductive type epitaxial layer 210 in the active region 204. In some embodiments, the patterning process includes a photolithography process and a subsequent etching process. The photolithography process is used to form a patterned mask (not shown), for example a patterned photoresist or a patterned hard mask, on a top surface 211 of the second conductive type epitaxial layer 210. The patterned mask has an opening to expose a portion of the second conductive type epitaxial layer 210. Then, the exposed portion of the second conductive type epitaxial layer 210 in the active region 204 is removed by the etching process to form the multiple trenches 212. In which, the portion of the second conductive type epitaxial layer 210 in the active region 204 is located between the trench isolation feature defined regions 202 (or surrounded by the trench isolation feature defined regions 202) of the substrate 200.

Each of the trenches 212 is respectively extended from the top surface 211 of the second conductive type epitaxial layer 210 to pass through a part of the second conductive type epitaxial layer 210. In some embodiments, each of the trenches 212 has a depth H1 (from the top surface 211 of the second conductive type epitaxial layer 210 to a bottom surface 216 of the trench 212). The depth H1 of the trench 212 is smaller than the thickness T2 of the second conductive type epitaxial layer 210. Moreover, the bottom surface 216 of each the trench 212 is located between the top surface 211 of the second conductive type epitaxial layer 210 and the diffused first conductive type buried layer 208A. In other words, the diffused first conductive type buried layer 208A is disposed directly under the bottom surface 216 of the trench 212. Moreover, a boundary 209A of the diffused first conductive type buried layer 208A is separated from the bottom surface 216 of the trench 212 by a distance. The above-mentioned etching process includes a dry etching, a wet etching or a combination thereof. The wet etching includes an immersion etching, a spray etching, a combination thereof, or other suitable wet etching. The dry etching includes a capacitively coupled plasma etching, an inductively coupled plasma etching, a helical plasma etching, an electron cyclotron resonance plasma etching, a combination thereof, or other suitable dry etching. The gas used for the dry etching includes inert gas, fluorine-containing gas, chloride-containing gas, bromine-containing gas, iodine-containing gas, a combination thereof, or other suitable gas. In some embodiments, the gas used for the dry etching includes Ar, $CF_4$, $SF_6$, $CH_2F_2$, $CHF_3$, $C_2F_6$, $Cl_2$, $CHCl_3$, $CCl_4$, HBr, $CHBr_3$, $BF_3$, $BCl_3$, a combination thereof, or other suitable gas.

Figure 6:
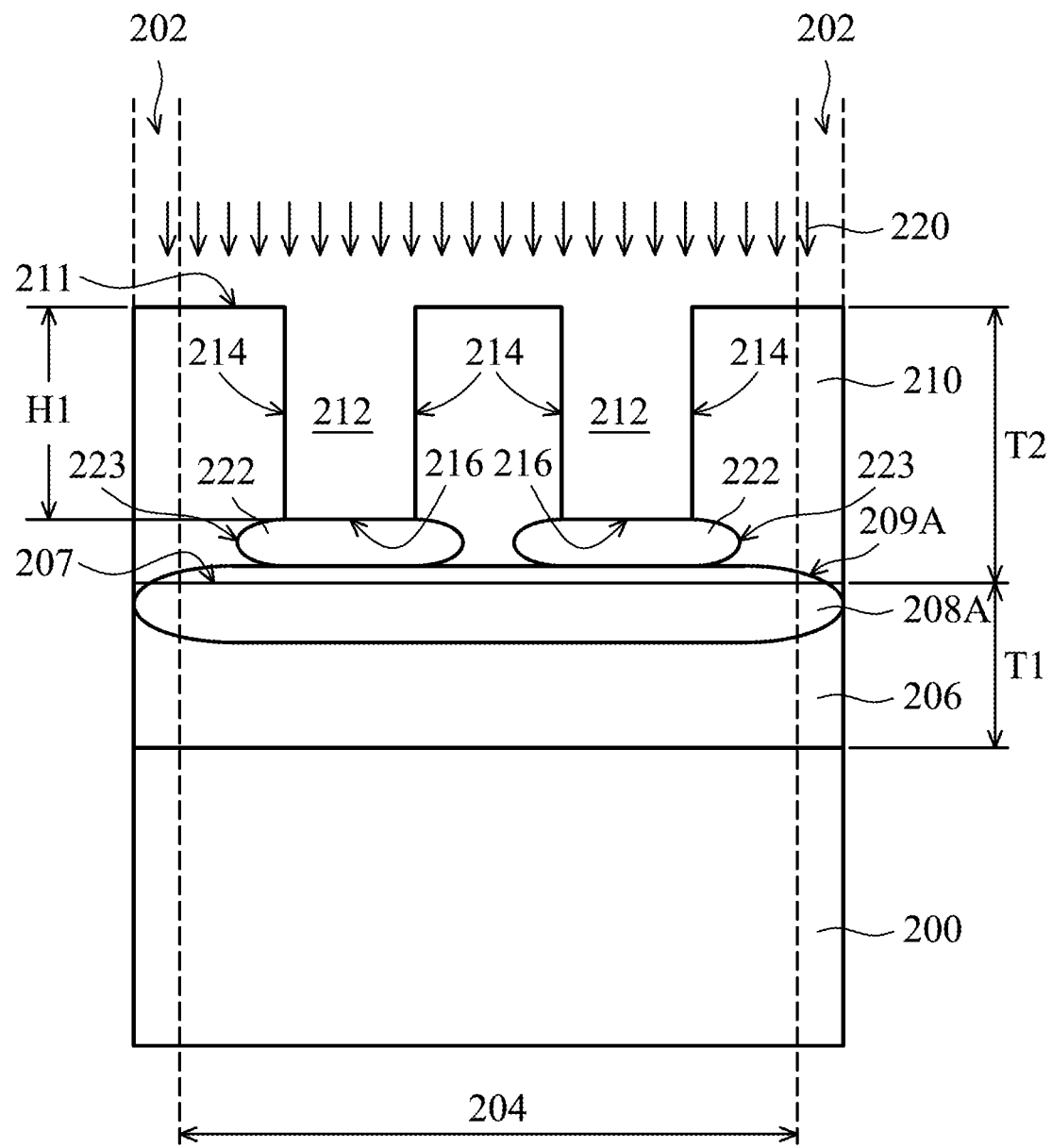

Then, referring to FIG. 6, a trench ion implantation process 220 is performed to form a first conductive type doped region 222 in a portion of the second conductive type epitaxial layer 210 that is exposed by the bottom surface 216 and a side surface 214 of the trench 212. The first conductive type doped region 222 has the first conductive type. For example, when the first conductive type is P-type, the first conductive type doped region 222 can be referred to a P-type doped region 222. In some embodiments, the first conductive type doped region 222 may surround the bottom surface 216 of the trench 212. Alternatively, the first conductive type doped region 222 may surround a part of the side surface 214 of the trench 212. Therefore, a depth of the first conductive type doped region 222 can be determined by the depth H1 of the trench 212. In addition, a boundary 223 of the first conductive type doped region 222 may overlap the boundary 209A of the diffused first conductive type buried layer 208A, or may be separated from the boundary 209A of the diffused first conductive type buried layer 208A by a distance that is smaller than or equal to 1 μm. In some embodiments, the first conductive type doped region 222 has a dopant concentration of about $10^{17}$ atoms/$cm^3$ to about $10^{20}$ atoms/$cm^3$. In some embodiments, the dopant concentration of the diffused first conductive type buried layer 208A can be designed to be greater than the dopant concentration of the first conductive type doped region 222 by at least one order of magnitude. For example, when the dopant concentration of the first conductive type doped region 222 is about $10^{17}$ atoms/$cm^3$, the dopant concentration of the diffused first conductive type buried layer 208A is about $10^{18}$ atoms/$cm^3$ to about $10^{21}$ atoms/$cm^3$.

Figure 7:
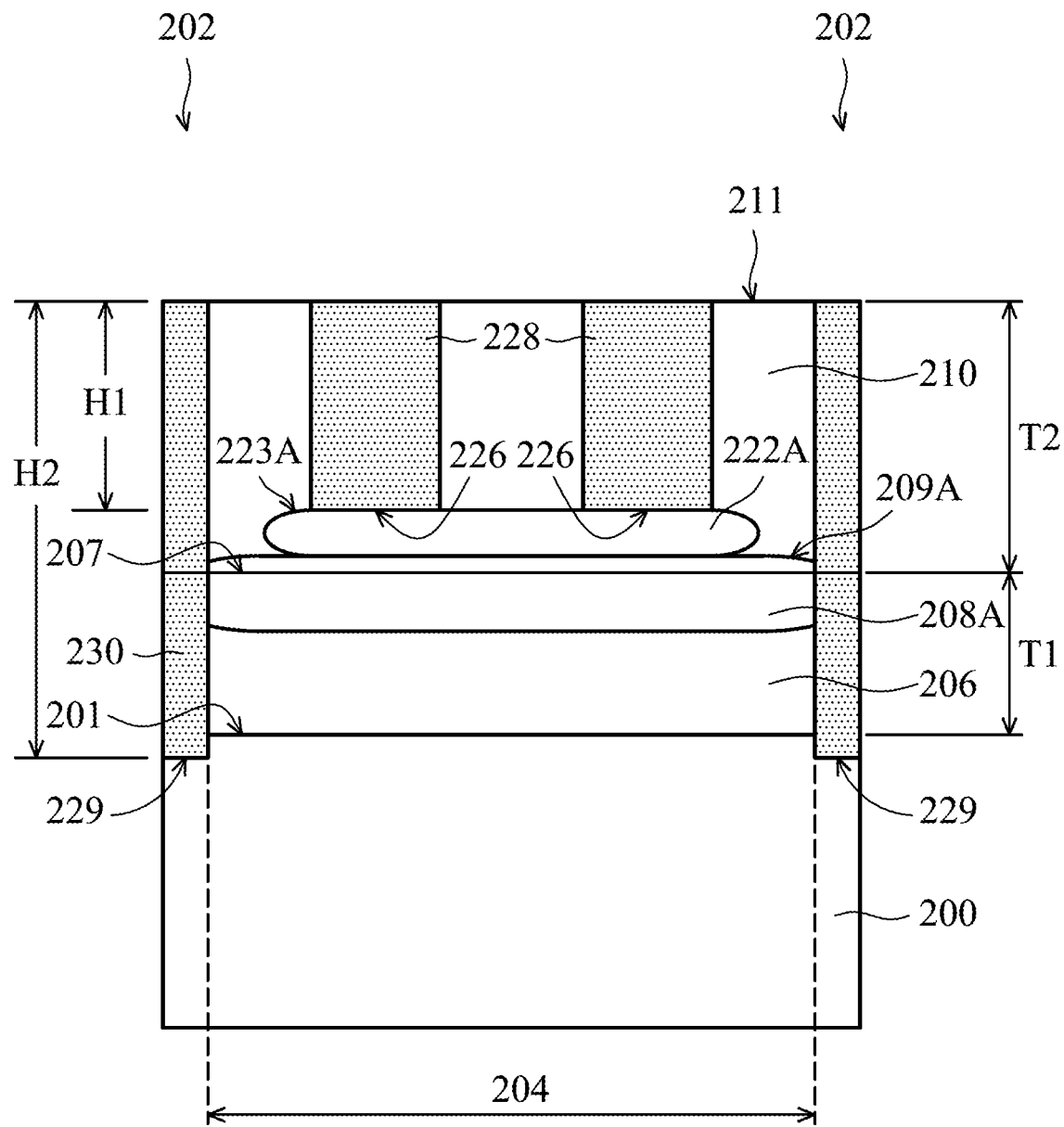

Next, referring to FIG. 7, trench isolation features 228 are formed in the trenches 212 (as shown in FIG. 6) in the active region 204. At the same time, trench isolation features 230 are formed in the trench isolation feature defined regions 202 that is adjacent to the active region 204 (i.e. at the boundary of the active region 204). In some embodiments, the trench isolation feature 228 located in the active region 204 fully fills the trench 212 (as shown in FIG. 6) and extends from the top surface 211 of the second conductive type epitaxial layer 210 into a part of the second conductive type epitaxial layer 210. In some embodiments, the depth of the trench isolation feature 228 is the same as the depth H1 of the trench 212. In addition, the trench isolation feature 230 located in the trench isolation feature defined region 202, which is adjacent to the active region 204, extends from the top surface 211 of the second conductive type epitaxial layer 210 to pass through the bottom surface of the second conductive type epitaxial layer 206 (located at the top surface 201 of the substrate 200) into the substrate 200. In other words, the depth H2 of each the trench isolation feature 230 from the top surface to the bottom surface thereof is larger than the depth H1 of the trench isolation feature 228 from the top surface to the bottom surface thereof.

In some embodiments, the trench isolation features 230 are located outside of the trench isolation features 228 and surround the trench isolation features 228. Moreover, the diffused first conductive type buried layer 208A is adjacent to the trench isolation features 230 and located directly under the trench isolation features 228. The diffused first conductive type buried layer 208A may be separated from a bottom surface 226 of the trench isolation feature 228 by a distance. In addition, the diffused first conductive type buried layer 208A is located between the bottom surface 226 of the trench isolation feature 228 and a bottom surface 229 of the trench isolation feature 230.

In some embodiments, the trench isolation feature 228 includes a shallow trench isolation (STI) feature, and the trench isolation feature 230 includes a deep trench isolation (DTI) feature. The trench isolation features 228 and 230 may be formed by performing a patterning process on the substrate 200 and the second conductive type epitaxial layers 206 and 210 thereon, subsequently performing an insulating material filling process and then performing a planarization process.

In some embodiments, the patterning process includes a photolithography process and a subsequent etching process. The photolithography process is used to form a patterned mask (not shown), for example a patterned photoresist or a patterned hard mask, on the top surface 211 of the second conductive type epitaxial layer 210. The patterned mask has an opening to expose a portion of the second conductive type epitaxial layer 210 in the trench isolation feature defined region 202. Then, the patterned mask is used to perform the etching process to remove a portion of the second conductive type epitaxial layer 210, a portion of the second conductive type epitaxial layer 206 and a portion of the substrate 200 for forming multiple trenches (not shown) in the trench isolation feature defined regions 202. The multiple trenches respectively extend from the top surface 211 of the second conductive type epitaxial layer 210 to pass through the second conductive type epitaxial layer 210, and further extend to pass through the bottom surface of the second conductive type epitaxial layer 206 (located at the top surface 201 of the substrate 200) into the substrate 200. The above-mentioned etching process includes a dry etching, a wet etching or a combination thereof. The wet etching includes an immersion etching, a spray etching, a combination thereof, or other suitable wet etching. The dry etching includes a capacitively coupled plasma etching, an inductively coupled plasma etching, a helical plasma etching, an electron cyclotron resonance plasma etching, a combination thereof, or other suitable dry etching. The gas used for the dry etching includes inert gas, fluorine-containing gas, chloride-containing gas, bromine-containing gas, iodine-containing gas, a combination thereof, or other suitable gas. In some embodiments, the gas used for the dry etching includes Ar, $CF_4$, $SF_6$, $CH_2F_2$, $CHF_3$, $C_2F_6$, $Cl_2$, $CHCl_3$, $CCl_4$, HBr, $CHBr_3$, $BF_3$, $BCl_3$, a combination thereof, or other suitable gas.

In some embodiments, the trenches in the active region and at the boundary thereof are fully filled with an insulating material (not shown) by the insulating material filling process. The insulating material filling process includes a chemical vapor deposition (CVD), a low pressure chemical vapor deposition (LPCVD), a low temperature chemical vapor deposition (LTCVD), a rapid thermal chemical vapor deposition (RTCVD), a plasma enhanced chemical vapor deposition (PECVD), an atomic layer deposition (ALD) of atomic layer chemical vapor deposition, or other suitable deposition. The insulating material includes silicon oxide, silicon nitride, silicon oxynitride, other suitable insulating material, or a combination thereof.

In some embodiments, the insulating material on the top surface 211 of the second conductive type epitaxial layer 210 is removed by the planarization process. The planarization process includes a chemical-mechanical polishing (CMP) process and/or an etch-back process. After the above-mentioned processes are performed, the trench isolation features 228 are formed in the trenches 212 (as shown in FIG. 6) in the active region 204, and the trench isolation features 230 are formed in the trench isolation feature defined regions 202 that are adjacent to the active region 204 (i.e. at the boundary of the active region 204).

In some embodiments, during the formation of the trench isolation features 228 and 230, the different first conductive type doped regions 222 located under the different trench isolation features 228 are combined into one diffused first conductive type doped region 222A due to the dopants in the different first conductive type doped regions 222 diffusing toward each other. The diffused first conductive type doped region 222A has a boundary 223A overlapped with the bottom surface 226 of the trench isolation feature 228 and the boundary 209A of the diffused first conductive type buried layer 208A. Moreover, the diffused first conductive type doped region 222A may contact and surround the bottom surface 226 of the trench isolation feature 228. In some embodiments, the diffused first conductive type doped region 222A may contact and surround a part of the sidewall of the trench isolation feature 228 (located at the sidewall 214 of the trench 212 as shown in FIG. 6).

Figure 8:
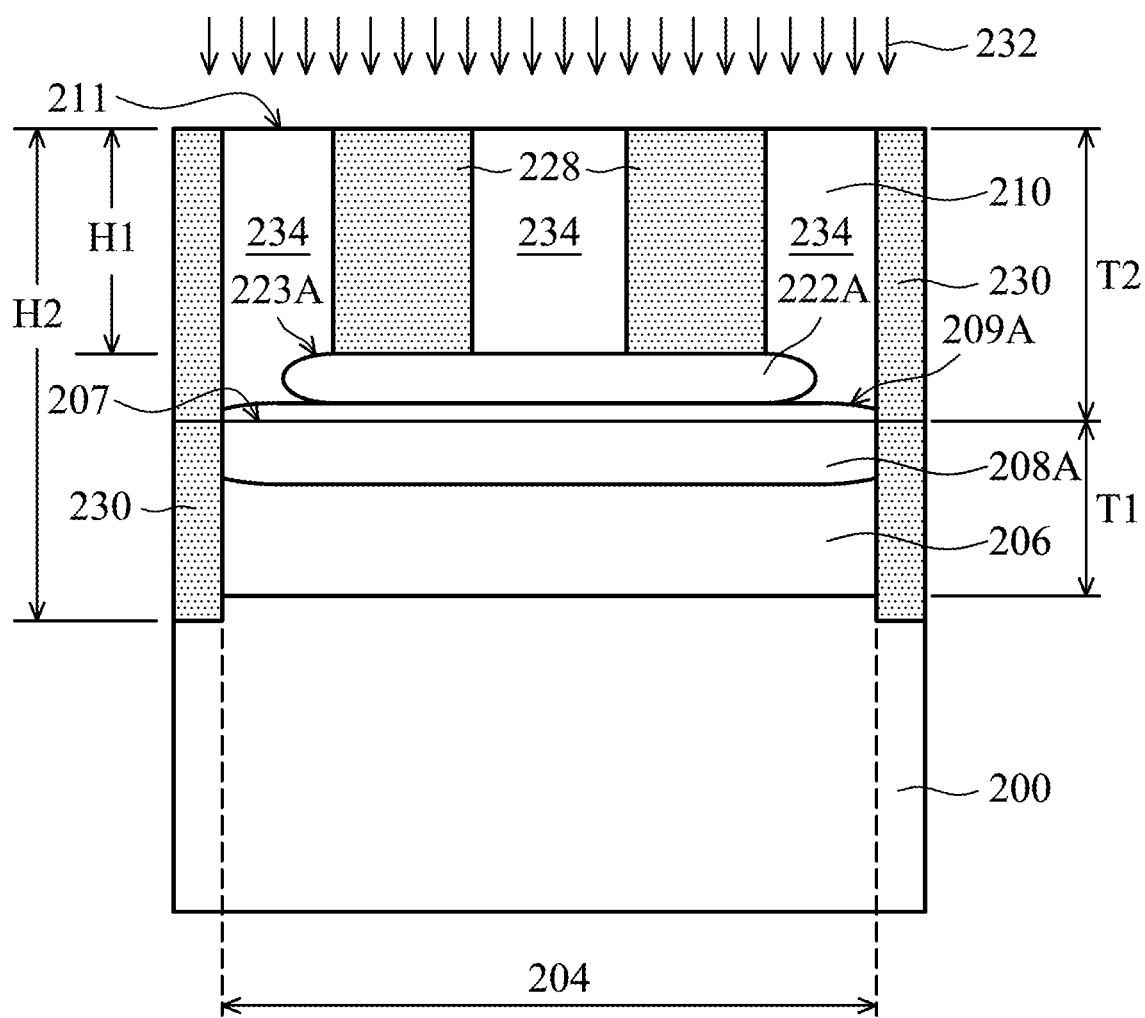

Referring to FIG. 8, another ion implantation process 232 is then performed on the second conductive type epitaxial layer 210 in the active region 204 to form a first conductive type doped well region 234. The first conductive type doped well region 234 has the first conductive type. For example, when the first conductive type is P-type, the first conductive type doped well region 234 can be referred to a P-type doped well region 234. In some embodiments, the first conductive type doped well region 234 has a dopant concentration of about $10^{17}$ atoms/cm$^3$ to about $10^{20}$ atoms/cm$^3$.

In some embodiments, the first conductive type doped well region 234 is located over the diffused first conductive type doped region 222A and the diffused first conductive type buried layer 208A. The first conductive type doped well region 234 has a top surface that is level with the top surface 211 of the second conductive type epitaxial layer 210. The first conductive type doped well region 234 has a bottom surface that is overlapped with the boundary 223A of the diffused first conductive type doped region 222A and/or the boundary 209A of the diffused first conductive type buried layer 208A. The first conductive type doped well region 234 has a depth that is smaller than or equal to the depth of the diffused first conductive type doped region 222A while determined from the top surface 211 of the second conductive type epitaxial layer 210. In addition, the first conductive type doped well region 234 may partially contact or surround the diffused first conductive type doped region 222A, and the sidewalls of the first conductive type doped well region 234 may contact the trench isolation features 228 and 230.

In some embodiments, the ion implantation process 232 and the ion implantation process 222 as shown in FIG. 6 have the same process condition. For example, the ion implantation process 232 and the ion implantation process 222 as shown in FIG. 6 have the same dopant, ion implantation energy and ion implantation dose. In addition, both the ion implantation processes 222 and 232 can be performed by using an ion implantation equipment with a low implantation energy (such as several thousands of electron volt (KeV)). Therefore, the first conductive type doped well region 234 and the diffused first conductive type doped region 222A in different depths have the same dopant concentration and are formed by using the same ion implantation equipment.

In some embodiments, the first conductive type doped well region 234 is connected to the diffused first conductive type buried layer 208A through the diffused first conductive type doped region 222A formed by the above-mentioned step. There is no second conductive type dopant (such as the dopant of the second conductive type epitaxial layer 206) presented between the first conductive type doped well region 234 and the diffused first conductive type buried layer 208A, and thereby an undesired silicon controlled rectifier (SCR) structure is not formed. Accordingly, the diffused first conductive type doped region 222A can be referred to a first conductive type connecting doped region.

Figure 9:
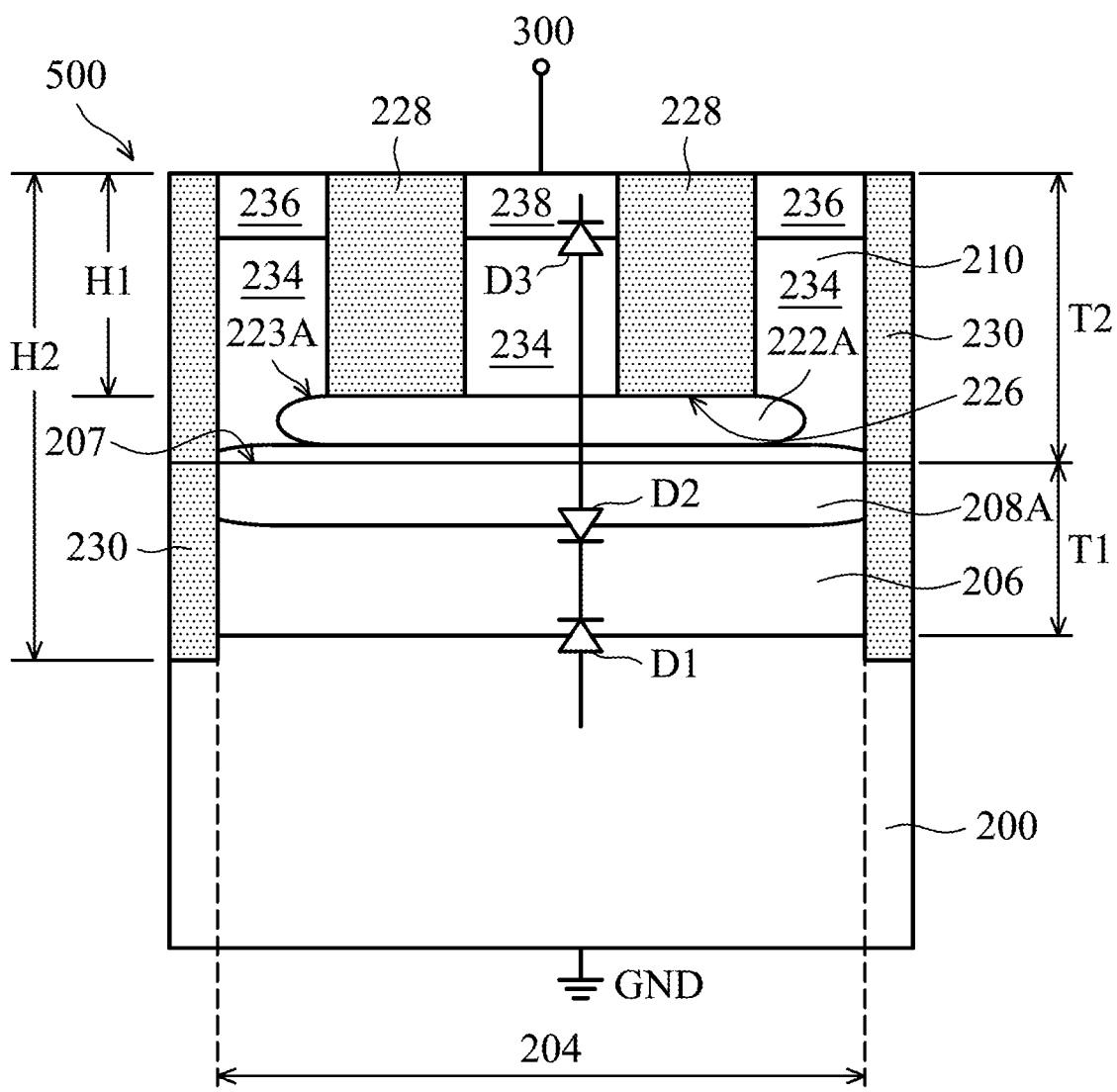

Next, referring to FIG. 9, another ion implantation process is performed to form a second conductive type heavily doped region 238 on the first conductive type doped well region 234 in the active region 204, in which the first conductive type doped well region 234 is surrounded by the trench isolation features 228. The second conductive type heavily doped region 238 has the second conductive type. For example, when the first conductive type is P-type, the second conductive type is N-type, and the second conductive type heavily doped region 238 has a dopant concentration of about $10^{19}$ atoms/cm$^3$ to about $10^{21}$ atoms/cm$^3$, the second conductive type heavily doped region 238 can be referred to a N-type heavily (N$^+$) doped region 238. In addition, the diffused first conductive type doped region 222A is disposed under the bottom surface 226 of the trench isolation feature 228, and is disposed between the diffused first conductive type buried layer 208A and the second conductive type heavily doped region 238.

Then, another ion implantation process is optionally performed to form a first conductive type heavily doped region 236 on the first conductive type doped well region 234 in the active region 204. The first conductive type heavily doped region 236 has the first conductive type. For example, when the first conductive type is P-type and the first conductive type heavily doped region 236 has a dopant concentration of about $10^{19}$ atoms/cm$^3$ to about $10^{21}$ atoms/cm$^3$, the first conductive type heavily doped region 236 can be referred to a P-type heavily (P$^+$) doped region 236. Moreover, the first conductive type heavily doped region 236 can be used as a pick-up doped region of the first conductive type doped well region 234. After the above-mentioned processes, the semiconductor device 500 according to some embodiments is completed.

As shown in FIG. 9, in some embodiments, the substrate 200 of the semiconductor device 500 is electrically coupled to ground, and the bottom of the substrate 200 is indicated with a ground symbol and letters of GND as shown in FIG. 9. In addition, the second conductive type heavily doped region 238 in the active region 204 of the semiconductor device 500 is electrically coupled to a high-voltage (Vcc) node 300.

As shown in FIG. 9, in the semiconductor device 500, a PN junction is formed at the interface between the second conductive type epitaxial layer 206 in the active region 204 and the substrate 200 with the first conductive type. In which, the interface between the second conductive type epitaxial layer 206 in the active region 204 and the first conductive type substrate 200 is indicated with a diode symbol of D1. The diode D1 is constituted from the second conductive type epitaxial layer 206 and the substrate 200 with the first conductive type.

As shown in FIG. 9, in the semiconductor device 500, a PN junction is formed at the interface between the second conductive type epitaxial layer 206 in the active region 204 and the diffused first conductive type buried layer 208A. In which, the interface between the second conductive type epitaxial layer 206 and the diffused first conductive type buried layer 208A is indicated with a diode symbol of D2. The diode D2 is constituted from the second conductive type epitaxial layer 206 and the diffused first conductive type buried layer 208A.

As shown in FIG. 9, in the semiconductor device 500, a PN junction is formed at the interface between the first conductive type doped well region 234 in the active region 204 and the second conductive type heavily doped region 238. In which, the interface between the first conductive type doped well region 234 and the second conductive type heavily doped region 238 is indicated with a diode symbol of D3. The diode D3 is constituted from the diffused first conductive type doped region 222A, the first conductive type doped well region 234 and the second conductive type heavily doped region 238.

Through the above-mentioned electrical connections, an anode of the diode D1 (the first conductive type substrate 200) is electrically coupled to the ground GND, and a cathode of the diode D1 (the second conductive type epitaxial layer 206) is connected to a cathode of the diode D2 (the second conductive type epitaxial layer 206) with a face-to-face connection. An anode of the diode D2 (the diffused first conductive type buried layer 208A) is connected to an anode of the diode D3 (the diffused first conductive type doped region 222A and the first conductive type doped well region 234) with a face-to-face connection. In addition, a cathode of the diode D3 (the second conductive type heavily doped region 238) is electrically coupled to the high-voltage (Vcc) node 300.

The embodiments of the disclosure provide semiconductor devices and methods of fabricating the same, for example transient-voltage-suppression (TVS) diode devices and methods of fabricating the same. In the semiconductor devices of the embodiments, shallow trenches are formed in the active region (or device region), which is defined by deep trench isolation (DTI) features, for isolating different elements. Moreover, a trench ion implantation process is performed by utilizing the shallow trenches to implant a dopant into an epitaxial layer through the bottom surface of the shallow trenches to form a connecting doped region. The connecting doped region is used for connecting a doped well region with a shallow depth to a buried layer with a deep depth in the semiconductor devices. Accordingly, the connecting doped region, the buried layer and the doped well region have the same conductive type. Moreover, the connecting doped region is located between the buried layer and the doped well region along a normal line direction of the top surface of the substrate. In addition, the trench ion implantation process of forming the connecting doped region and a well region ion implantation process of forming the doped well region have the same process condition (such as dopant, ion implantation energy and ion implantation dose). Through forming the connecting doped region, the semiconductor devices of the embodiments can avoid forming an undesired silicon controlled rectifier structure that is due to a poor connection between the buried layer and the doped well region caused by conventional processes. Moreover, the breakdown voltage of the semiconductor devices of the embodiments can be enhanced. In addition, the above-mentioned trench ion implantation process can be performed by utilizing an ion implantation equipment with a low ion implantation energy (such as several thousands of electron volt (KeV)) to replace an ion implantation equipment with a high ion implantation energy (such as several millions of electron volt (KeV)). Therefore, a connecting doped region with a deep depth (for example about 6 μm to about 8 μm) can be formed under a process condition with an effectively reduced fabrication cost. The shallow trench formed in the device region and the subsequent trench ion implantation process of the embodiments of the disclosure can be applied to other types of semiconductor devices to form a connecting doped region with a predetermined depth (according to the depth of the shallow trench in the device region). The connecting doped region can be used for connecting multiple doped regions having different depths to each other in a semiconductor device. Moreover, in the embodiments of the disclosure, two thin-epitaxial growth processes are utilized to form a semiconductor device constituted from two thin epitaxial layers (such as a transient-voltage-suppression (TVS) diode device). Therefore, the process steps of fabricating the semiconductor device are simplified and the fabrication cost thereof is also reduced.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate having a first conductive type and an active region;
   a second conductive type first epitaxial layer disposed over the substrate, wherein the second conductive type first epitaxial layer has a second conductive type, and the second conductive type is different from the first conductive type; and
   a second conductive type second epitaxial layer disposed over the second conductive type first epitaxial layer, wherein the second conductive type second epitaxial layer has the second conductive type;
   wherein the active region comprises:
      a first conductive type buried layer disposed in the second conductive type first epitaxial layer and the second conductive type second epitaxial layer;
      a first conductive type doped well region disposed in the second conductive type second epitaxial layer and having the first conductive type;
      a second conductive type heavily doped region disposed over the first conductive type doped well region and having the second conductive type;
      a first trench isolation feature disposed in the substrate; and
      a first conductive type doped region disposed between a bottom surface of the first trench isolation feature and the first conductive type buried layer.

2. The semiconductor device as claimed in claim 1, wherein the first conductive type doped region surrounds a sidewall and the bottom surface of the first trench isolation feature.

3. The semiconductor device as claimed in claim 1, wherein the first conductive type doped well region and the first conductive type doped region have the same dopant concentration.

4. The semiconductor device as claimed in claim 1, further comprising a second trench isolation feature disposed in the substrate, wherein the second trench isolation feature has a second depth and is located at a boundary of the active region.

5. The semiconductor device as claimed in claim 4, wherein the second trench isolation feature extends from a top surface of the second conductive type second epitaxial layer and passes through a bottom surface of the second conductive type first epitaxial layer into the substrate.

6. The semiconductor device as claimed in claim 4, wherein the first trench isolation feature has a first depth and extends from a top surface of the second conductive type second epitaxial layer into a part of the second conductive type second epitaxial layer.

7. The semiconductor device as claimed in claim 6, wherein the first depth is smaller than the second depth.

8. The semiconductor device as claimed in claim 4, wherein the second trench isolation feature surrounds the first trench isolation feature.

9. The semiconductor device as claimed in claim 4, wherein the first conductive type buried layer is adjacent to the second trench isolation feature and located directly under the first trench isolation feature.

10. The semiconductor device as claimed in claim 9, wherein the first conductive type buried layer is separated from the bottom surface of the first trench isolation feature by a distance.

11. The semiconductor device as claimed in claim 4, wherein the first conductive type buried layer is located between a bottom surface of the second trench isolation feature and the bottom surface of the first trench isolation feature.

12. The semiconductor device as claimed in claim 1, wherein the substrate and the second conductive type first epitaxial layer constitute a first diode; the second conductive type first epitaxial layer and the first conductive type buried layer constitute a second diode; and the first conductive type buried layer, the first conductive type doped well region and the second conductive type heavily doped region constitute a third diode.

13. The semiconductor device as claimed in claim 12, wherein an anode of the first diode is electrically coupled to a ground, a cathode of the first diode is electrically coupled to a cathode of the second diode, an anode of the second diode is electrically coupled to an anode of the third diode, and a cathode of the third diode is electrically coupled to a high-voltage node.

14. The semiconductor device as claimed in claim 1, wherein the first trench isolation feature surrounds the second conductive type heavily doped region.

15. A method of fabricating a semiconductor device, comprising:

providing a substrate having a first conductive type and an active region;

performing a first epitaxial growth process to form a second conductive type first epitaxial layer over the substrate, wherein the second conductive type first epitaxial layer has a second conductive type, and the second conductive type is different from the first conductive type;

performing a first ion implantation process to form a first conductive type buried layer in the second conductive type first epitaxial layer in the active region, wherein the first conductive type buried layer has the first conductive type;

performing a second epitaxial growth process to form a second conductive type second epitaxial layer over the second conductive type first epitaxial layer, wherein the second conductive type second epitaxial layer has the second conductive type;

forming a first trench in the second conductive type second epitaxial layer in the active region, wherein a bottom surface of the first trench is located between a top surface of the second conductive type second epitaxial layer and the first conductive type buried layer;

performing a second ion implantation process to form a first conductive type doped region in the second conductive type second epitaxial layer that is exposed by the bottom surface of the first trench;

forming a first trench isolation feature in the first trench, and forming a second trench isolation feature at a boundary of the active region; and performing a third ion implantation process to form a first conductive type doped well region in the second conductive type second epitaxial layer in the active region, wherein the first conductive type doped well region has the first conductive type.

16. The method as claimed in claim 15, further comprising after the first conductive type doped well region is formed, performing a fourth ion implantation process to form a second conductive type heavily doped region over the first conductive type doped well region that is surrounded by the first trench isolation feature, wherein the second conductive type heavily doped region has the second conductive type.

17. The method as claimed in claim 15, wherein the forming of the first trench isolation feature and the second trench isolation feature comprises:

forming a second trench at the boundary of the active region after the first conductive type doped region is formed, wherein the second trench extends from a top surface of the second conductive type second epitaxial layer and passes through a bottom surface of the second conductive type first epitaxial layer into the substrate; and filling the first trench and the second trench with an insulating material.

18. The method as claimed in claim 15, wherein after the second conductive type second epitaxial layer is formed, a dopant in the first conductive type buried layer diffuses from the second conductive type first epitaxial layer into a part of the second conductive type second epitaxial layer.

19. The method as claimed in claim 15, wherein the second ion implantation process and the third ion implantation process are performed by the same dopant, the same ion implantation energy, or the same ion implantation dose.

20. The method as claimed in claim 15, wherein a boundary of the first conductive type doped region overlaps a bottom surface of the first trench isolation feature and a boundary of the first conductive type buried layer.

* * * * *